US006927476B2

United States Patent
Freeman et al.

(10) Patent No.: US 6,927,476 B2
(45) Date of Patent: Aug. 9, 2005

(54) BIPOLAR DEVICE HAVING SHALLOW JUNCTION RAISED EXTRINSIC BASE AND METHOD FOR MAKING THE SAME

(75) Inventors: Gregory G. Freeman, Hopewell Junction, NY (US); Seshadri Subbanna, Brewster, NY (US); Basanth Jagannathan, Beacon, NY (US); Kathryn T. Schonenberg, Fairfield, CT (US); Shwu-Jen Jeng, Wappingers Fall, NY (US); Kenneth J. Stein, Sandy Hook, CT (US); Jeffrey B. Johnson, Essex Junction, VT (US)

(73) Assignee: Internal Business Machines Corporation, Armonk, NY (US)

( * ) Notice: Subject to any disclaimer, the term of this patent is extended or adjusted under 35 U.S.C. 154(b) by 22 days.

(21) Appl. No.: 09/962,738

(22) Filed: Sep. 25, 2001

(65) Prior Publication Data

US 2003/0057458 A1 Mar. 27, 2003

(51) Int. Cl.⁷ .................... H01L 27/082; H01L 27/102; H01L 29/70; H01L 31/11
(52) U.S. Cl. ...................................... 257/586; 348/343
(58) Field of Search ................................ 257/198, 201, 257/272, 273, 565, 584, 586, 592, 593, 735, 736, 197, 737

(56) References Cited

U.S. PATENT DOCUMENTS 3,737,742 A * 6/1973 Breuer et al. ................ 317/235
4,617,724 A 10/1986 Yokoyama et al.
5,015,594 A 5/1991 Chu et al.

(Continued)

FOREIGN PATENT DOCUMENTS

| EP | 0 292 278 | 5/1988 |
| JP | 406333937 A | * 12/1994 |
| JP | 2000-12422 | 1/2000 |

OTHER PUBLICATIONS

Claims of co–pending U.S. Appl. No. 09/887,310.

*Primary Examiner*—Long Pham
*Assistant Examiner*—Dana Farahani
(74) *Attorney, Agent, or Firm*—Joseph P. Abate

(57) ABSTRACT

A raised extrinsic base, silicon germanium (SiGe) heterojunction bipolar transistor (HBT), and a method of making the same is disclosed herein. The heterojunction bipolar transistor includes a substrate, a silicon germanium layer formed on the substrate, a collector layer formed on the substrate, a raised extrinsic base layer formed on the silicon germanium layer, and an emitter layer formed on the silicon germanium layer. The silicon germanium layer forms a heterojunction between the emitter layer and the raised extrinsic base layer. The bipolar transistor further includes a base electrode formed on a portion of the raised extrinsic base layer, a collector electrode formed on a portion of the collector layer, and an emitter electrode formed on a portion of the emitter layer. Thus, the heterojunction bipolar transistor includes a self-aligned raised extrinsic base, a minimal junction depth, and minimal interstitial defects influencing the base width, all being formed with minimal thermal processing. The heterojunction bipolar transistor simultaneously improves three factors that affect the speed and performance of bipolar transistors: base width, base resistance, and base-collector capacitance.

34 Claims, 2 Drawing Sheets

U.S. PATENT DOCUMENTS

| | | | | |
|---|---|---|---|---|
| 5,064,772 A | | 11/1991 | Jambotkar | |
| 5,101,256 A | * | 3/1992 | Harame et al. | 357/34 |
| 5,128,271 A | | 7/1992 | Bronner et al. | |
| 5,147,775 A | | 9/1992 | Ota et al. | |
| 5,315,151 A | * | 5/1994 | Hsieh et al. | 257/592 |
| 5,459,084 A | | 10/1995 | Ryum et al. | |
| 5,494,836 A | | 2/1996 | Imai | |
| 5,506,427 A | | 4/1996 | Imai | |
| 5,656,515 A | | 8/1997 | Chandrasekhar et al. | |
| 5,766,999 A | | 6/1998 | Sato | |
| 5,834,800 A | * | 11/1998 | Jalali-Farahani | 257/198 |
| 5,903,018 A | | 5/1999 | Shimawaki | |
| 5,962,880 A | * | 10/1999 | Oda et al. | 257/198 |
| 6,097,046 A | | 8/2000 | Plumton | |
| 6,337,494 B1 | * | 1/2002 | Ryum et al. | 257/197 |
| 6,346,453 B1 | | 2/2002 | Kovacic et al. | |
| 6,429,085 B1 | | 8/2002 | Pinter | |
| 6,437,376 B1 | | 8/2002 | Ozkan | |
| 6,472,262 B2 | | 10/2002 | Chantre et al. | |
| 6,559,020 B1 | | 5/2003 | Salmi | |

* cited by examiner

BIPOLAR DEVICE HAVING SHALLOW JUNCTION RAISED EXTRINSIC BASE AND METHOD FOR MAKING THE SAME

BACKGROUND OF THE INVENTION

A. Field of the Invention

The present invention relates generally to semiconductor devices, and, more particularly to a bipolar device having a shallow junction raised extrinsic base, and a method for making such a device.

B. Description of the Related Art

Bipolar transistors are three-region, two-junction devices. A typical heterojunction bipolar transistor (HBT) is fabricated by sequentially forming on a substrate, a collector layer or region, a base layer or region, and an emitter layer or region. An emitter electrode is formed on the emitter layer. A base electrode is formed on the base layer, on the same side of the substrate and adjacent to the emitter electrode.

Electrically, bipolar transistors can be thought of as two diodes back to back. The current flows from the emitter region through the base into the collector. When there is no current to the base, the transistor is turned off. When it is on, the current flows. It only takes a small current to turn the base on enough to allow current flow through the entire transistor.

Most bipolar circuits are designed with NPN transistors. NPN represents the respective conductivity types of the emitter, base, and collector. Bipolar transistors feature fast switching speeds. The speed and performance of a bipolar transistor is governed by a number of factors, including vertical base dopant film thickness (base width), the base resistance, and the base-collector capacitance.

One factor affecting the speed and performance of a bipolar transistor is the base width. Ideally, the base width is made as small as possible. Minimizing the base width is achieved through minimization of the deposited dimension (for a base layer formed through epitaxy deposition), minimization of the high temperature processing, and/or minimization of the quantity of silicon interstitial defects, which enhances diffusion of the base dopants.

Another factor affecting the speed and performance of a bipolar transistor is the base resistance. Reduction in the base resistance for a given emitter region size involves defining a self-aligned extrinsic base with low resistance, and forming the extrinsic base in close proximity to an intrinsic, higher resistance portion of the device. With close proximity of the extrinsic base to the intrinsic base, the base resistance may be reduced by up to fifty percent for narrow emitter bipolar devices. Further increasing the proximity of the extrinsic base to the intrinsic base could achieve even lower base resistance, except for the increasing influence the extrinsic base has on widening the intrinsic base through the inevitable presence of silicon interstitial defects in the extrinsic base. Thus, the reduction of base resistance through closer proximity of the extrinsic base to the intrinsic base eventually results in an undesirable tradeoff with wider base film thicknesses.

A third factor affecting the speed and performance of a bipolar transistor is the collector-base capacitance. The dominant element of this capacitance is the junction capacitance. The undesirable, or parasitic, element of this capacitance is the intersection of the extrinsic base with the collector region. This may be minimized with the shallowing of the extrinsic base diffusion.

Although improvements have been made individually in each of the factors affecting the speed and performance of bipolar transistors, simultaneous improvement of base width, base resistance, and base-collector capacitance has not been achieved. Thus there is a need in the art to provide a heterojunction bipolar transistor having simultaneously improved base width, base resistance, and base-collector capacitance over conventional bipolar devices.

SUMMARY OF THE INVENTION

The present invention satisfies the need of the related art by providing a raised extrinsic, epitaxial base, silicon germanium (SiGe) heterojunction bipolar transistor (HBT), and a method of making the same. The HBT of the present invention includes a self-aligned raised extrinsic base, minimal junction depth, and minimal interstitial defects influencing the base width, all formed with minimal thermal processing.

As embodied and broadly described herein, the present invention is broadly drawn to a heterojunction bipolar transistor and a method of the same. The HBT includes a substrate, and a silicon germanium layer formed by blanket epitaxy on the substrate. A collector layer is also formed on the substrate, and a raised extrinsic base layer is formed on the silicon germanium layer. An emitter layer is also formed on the silicon germanium layer, and the silicon germanium layer creates a heterojunction between the emitter layer and the raised extrinsic base layer. The HBT further includes an emitter contact or electrode formed on emitter layer, a base contact or electrode formed on the raised extrinsic base layer, and a collector contact or electrode formed on the collector layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention. In the drawings.

DETAILED DESCRIPTION OF EMBODIMENTS OF THE INVENTION

Reference will now be made in detail to the present embodiments of the invention, examples of which are illustrated in the accompanying drawings. Wherever possible, the same reference numbers will be used throughout the drawings to refer to the same or like parts.

The present invention is drawn broadly to a bipolar device having a shallow junction raised extrinsic base and a method for making such a device. The method for making the bipolar device of the present invention Will be described in conjunction with the description of the bipolar device structure, with reference to FIGS. 1–13.

Figure 1:
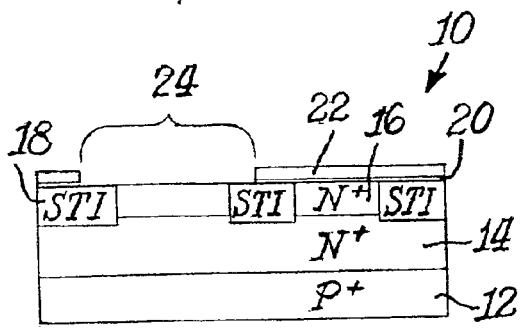
FIGS. 1–13 are cross-sectional views of a bipolar device having a shallow junction raised extrinsic base in accordance with an embodiment of the present invention, and as it is formed in accordance with a method of the present invention.

Referring now specifically to the drawings, an embodiment of the bipolar device of the present invention is illustrated in FIGS. 1–13, and shown generally as reference numeral 10. A semiconductor wafer or substrate 12, as shown in FIG. 1, is provided as the starting material for the bipolar device of the present invention. Substrate 12 may be made from a variety of materials, including a silicon material having a positive (p+ or p−) type conductivity, or having a p− type conductivity on a p+ type conductivity. In the initial steps of the method of the present invention, conventional processing techniques may be performed on substrate 12 to form isolation regions such as shallow trench isolation (STI) regions 18, and/or deep trench isolation regions, a deep subcollector 14, and a collector contact region 16.

The dopant for subcollector 14 and collector contact region 16 is preferably a negative (n) type, such as arsenic, antimony, or phosphorous having a concentration between $10^{18}$ to $10^{21}$ atoms/cm$^3$. Subcollector 14 may have a variety of thicknesses, but preferably has a thickness of between 0.5 to 2.0 microns ($\mu$m), and may be located between 0 to 2.0 $\mu$m from the top surface of substrate 12, as shown in FIG. 1.

In the next step of the method for making the bipolar device of the present invention, as shown in FIG. 1, a layer or film 20 of silicon dioxide (SiO$_2$) or other material capable of forming an etch-stop dielectric is deposited or grown through oxidation across the complete surface of the device 10 shown in FIG. 1. Preferably, silicon dioxide layer 20 has a thickness in the range of 10 to 50 nanometers (nm). A layer or film 22 of polysilicon or amorphous silicon may be subsequently deposited upon silicon dioxide layer 20 to form a seed layer, although layer 22 may be omitted. Preferably, optional layer 22 has a thickness in the range of 10 to 100 nm.

Conventional photolithographic and etching techniques may be employed to remove a portion of polysilicon layer 22, and a portion of silicon dioxide layer 20. The removed portions of polysilicon layer 22 and silicon dioxide layer 20 occur over a region 24 which will become an intrinsic region of the bipolar device 10 of the present invention. Silicon dioxide layer 20 and polysilicon layer 22 remain over collector contact region 16, as well as other regions of the bipolar device 10.

Figure 2:
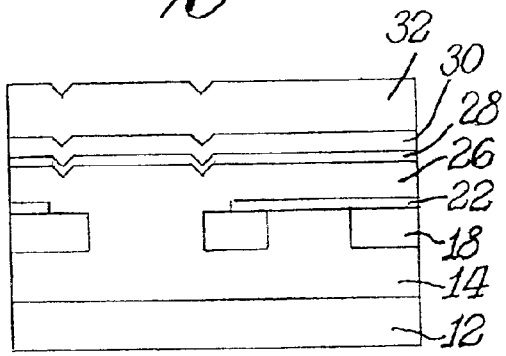

The next steps of the method of the present invention are shown in FIG. 2. First, a semiconductor layer or film 26 is deposited upon the upper surface of the device shown in FIG. 1, including polysilicon layer 22 and intrinsic region 24. Alternatively, film 26 may be omitted. Film 26 grows epitaxially on region 24 and may grow polycrystalline over other regions of bipolar device 10, although it is not necessary that film 26 continue beyond the single crystalline on region 24. Although film 26 is to be selectively grown over region 24, it may also be deposited as a blanket film (epitaxially) over the entire device. Film 26 preferably includes silicon germanium (SiGe) grown through blanket epitaxy, and makes up the deposited intrinsic base of bipolar device 10 of the present invention.

In the next steps of the method of the present invention, as shown in FIG. 2, additional layers or films are deposited upon SiGe film 26. These additional films are mandrel films that will be later removed, and thus their choice of construction may vary depending upon their selectivity to various etches. By way of example only, one construction may include a silicon dioxide (SiO$_2$) layer or film 28 grown or deposited upon SiGe film 26, a polysilicon layer or film 30 deposited upon silicon dioxide film 28, and a silicon nitride layer or film 32 deposited upon polysilicon film 30. Typical thicknesses for silicon dioxide film 28, polysilicon film 30, and silicon nitride film 32 may range from 5 to 20 nm, 50 to 300 nm, and 50 to 300 nm, respectively.

Figure 3:
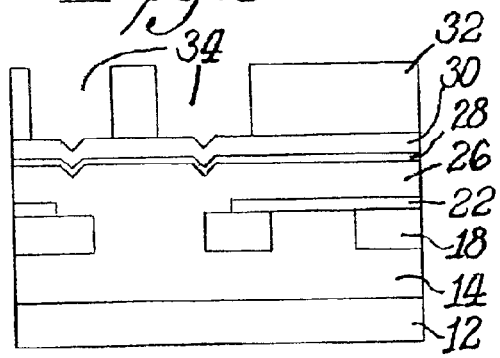
Figure 4:
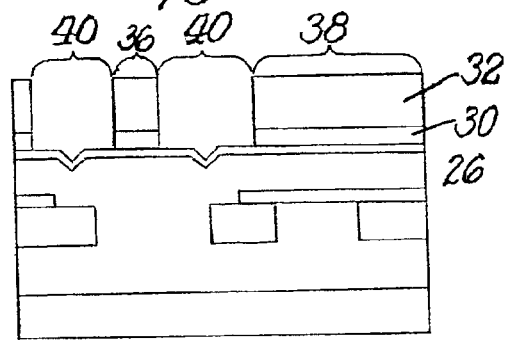

As shown in FIGS. 3 and 4, the next steps of the method include etching portions of silicon nitride film 32 using conventional photolithographic and etching techniques, and etching portions of polysilicon film 30 that lie below the etched portions of silicon nitride film 32 using a conventional anisotropic etch process, to form openings 34. Since portions of silicon nitride film 32 are covered with a photoresist, it is not etched in a region 36 of the intended emitter of the bipolar device 10, and in a large region 38 outside the region of intrinsic device operation, as shown in FIG. 4. Films 32, 30 are removed over where low resistance regions 40 of the extrinsic base of bipolar device 10 are intended. Preferably, silicon dioxide film 28 remains in regions 36, 38, 40.

Figure 5:
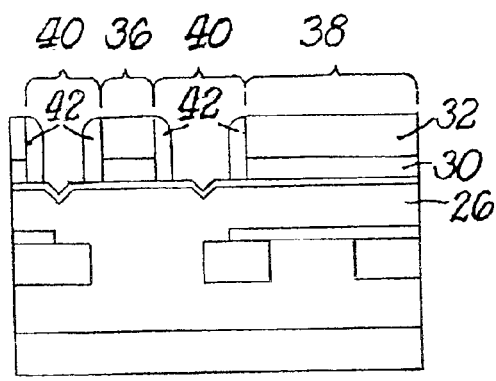

In a next step of the method, as shown in FIG. 5, sidewall spacers 42 are formed on the sidewalls of the remaining portions of polysilicon film 30 and silicon nitride film 32, using conventional deposition and etch procedures. Sidewall spacers 42 may be formed from a variety of materials, including for example, silicon nitride, silicon dioxide, or a combination of the two. The width of each spacer 42 may vary in the range of 10 to 70 nm.

Figure 6:
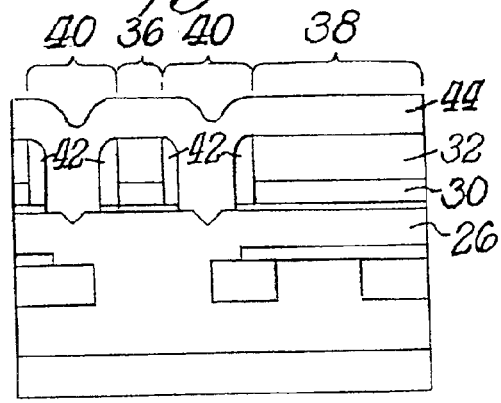

In the next step of the method of the present invention, as shown in FIG. 6, the silicon dioxide film 28 is removed in region 40, and a layer or film 44 that will form the raised extrinsic base is deposited upon the upper surface of the device shown in FIG. 5. Film 44 may be a highly-doped, extrinsic, polysilicon or an amorphous silicon, and may or may not be in-situ doped. If film 44 is in-situ doped, the dopant type will be the same conductivity as the base dopant. For an NPN-type transistor, the dopant is typically boron. Film 44 may be deposited to a thickness greater than the total thickness of films 28, 30, 32.

Figure 7:
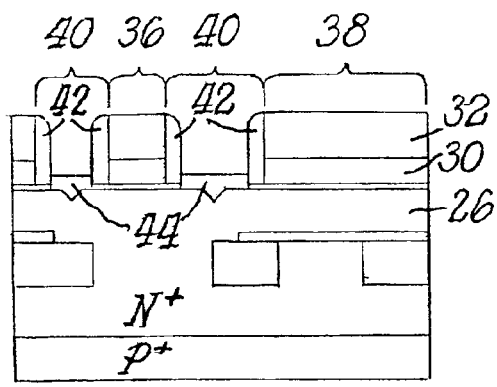

In the next step of the method, as shown in FIG. 7, film 44 is planarized to the top surface of silicon nitride film 32 using a conventional planarization process such as a chemical-mechanical polishing (CMP) technique, and recessed to a thickness in the range of 20 to 100 nm, using a conventional etch technique. If film 44 was not doped during deposition, it may be doped following the recess process through a blanket implantation operation. Planarization of film 44 minimizes resistive elements common in non-planar surfaces, and enables formation of uniform salicide layers on film 44, resulting in increased device performance.

Figure 8:
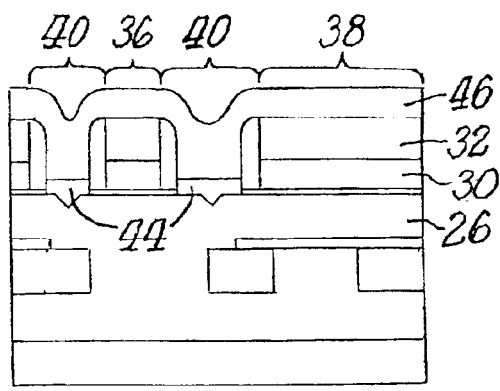
Figure 9:
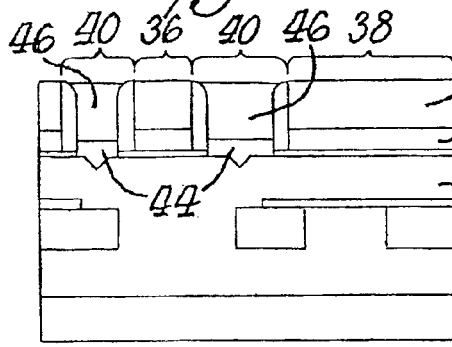

As shown in FIGS. 8 and 9, the next steps of the method of the present invention include depositing an insulating film 46 upon the top surface of the device shown in FIG. 7, and planarizing insulating film 46 to the top of silicon nitride film 32 using a conventional CMP technique. Insulating film 46 is preferably deposited to a thickness greater than the total thicknesses of films 28, 30, 32 less the thickness of film 44. Insulating film 46 may be made from a variety of materials, including but not limited to deposited silicon dioxide.

Figure 10:
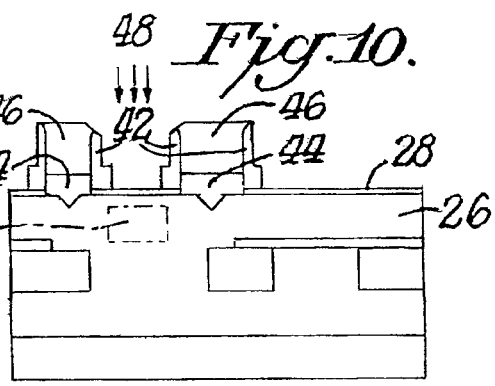

As shown in FIG. 10, the next step of the method includes removing mandrel films 32, 30 using a combination of conventional wet etch and dry etch techniques. Mandrel films 32, 30 may be removed from both regions 36, 38, or photolithographically limited to removal from region 36. Spacers 42 remain intact during this removal step in order to electrically isolate the emitter and base of bipolar device 10. If required, to reduce the well-known "base push-out" effect during device operation, a collector dopant 48 may be implanted following removal of mandrel films 32 and 30, through the opening of region 36 to form a self-aligned collector 50. Dopant implant forms self-aligned collector 50 since it will be blocked from portions of single-crystal silicon outside region 36 of bipolar device 10 if films 28, 30, 32 are sufficiently thick.

Figure 11:
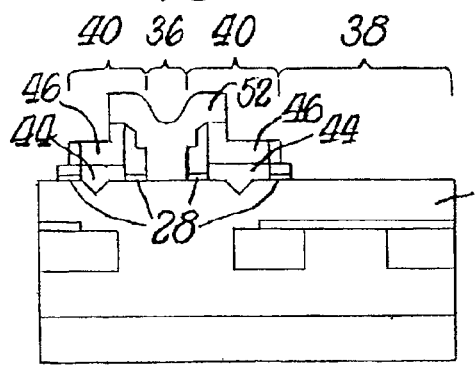

As shown in FIG. 11, the next step of the method includes removing silicon dioxide film 28, at least in region 36, with a conventional wet etch technique. A polysilicon or amorphous silicon film 52 having a thickness in the range of 30 to 200 nm may then be deposited upon the device shown in FIG. 10. Film 52 may be in-situ doped with the polysilicon or amorphous silicon deposition, or implanted following the deposition. If a dopant is used, the dopant is preferably an in-situ doped phosphorous that minimizes the temperatures required to diffuse the dopant slightly into the SiGe film 26, as opposed to arsenic which requires higher temperatures. Standard photolithographic steps are then employed to mask the region of polysilicon film 52 to remain following a conventional anisotropic etch, and form the emitter contact in region 36.

Figure 12:
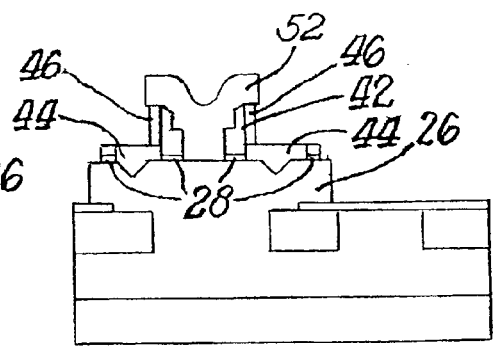

Standard photolithographic steps are then employed to mask portions of SiGe film 26, followed by an anisotropic etch, and formation of base contact regions, as shown in FIG. 12. Conventional drive-in emitter anneal, salicide and dielectric deposition (to form layer 54), contact formation, and metal interconnect formation steps are then employed to form an emitter contact or electrode 56, a base contact or electrode 58, and a collector contact or electrode 60, separated from each other by a film 54, as shown in FIG. 13.

Figure 13:
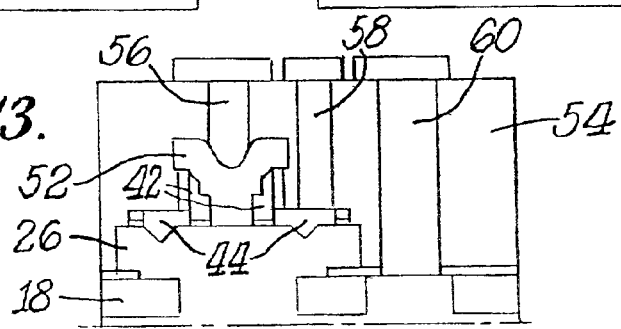

FIG. 13 shows the complete bipolar device having a shallow junction raised extrinsic base of the present invention. However, subsequent processing steps may be performed on the bipolar device 10 to create other semiconductor devices. For example, a variable junction capacitor (commonly known as a varactor) may be created with the junction formed between the shallow extrinsic base with an implant of an n-type dopant added to the previously-described process prior to film 44 deposition, as shown in FIG. 6. Emitter region 36 would be omitted from the device layout in this case. Alternatively, an electro-static discharge device may be created by eliminating the emitter 52 from the device layout and utilizing the p-n junction available in the device, as described above.

The HBT of the present invention includes a raised, self-aligned, extrinsic base, minimal junction depth, and minimal interstitial defects influencing the base width, all formed with minimal thermal processing. These device properties are a result of the method of forming an HBT having a raised extrinsic base, and the overall temperature requirements to achieve this device structure in accordance with the method of the present invention. The extrinsic base 44 is raised by being placed upon the SiGe epitaxial film 26, and is self-aligned to the emitter through the mandrel films and sidewall spacer formation steps. The extrinsic base 44 is also treated with only low-temperature processing, such as, for example, less than 750° C., which maintains an extremely shallow extrinsic base junction depth. For example, the extrinsic base junction of the present invention has a depth of 30 nanometers (nm), whereas conventional devices have extrinsic base junction depths of 100 nm. The shallow extrinsic base junction depth maintains the lowest collector-base capacitance possible by minimizing the extrinsic base interaction with the collector pedestal (reference numeral 50 in FIG. 10).

The raised extrinsic base also prevents damage that may be caused in conventional HBTs having an extrinsic base implanted into an SiGe film. One possible damage prevented causes the intrinsic base of the NPN device to widen, which reduces the performance of the device, or would require the implant to be sufficiently far from the emitter region of the device that the access resistance to the device is prohibitively large.

Furthermore, the complete integration method of the present invention does not require the high-temperature oxidation steps used in conventional methods (e.g., 900° C.), and may be accomplished with all low-temperature film deposition steps (e.g., approximately between 600° C. and 750° C.), except for the conventional drive-in emitter anneal step which is performed at a temperature slightly greater than 900° C., but only for a short amount of time (e.g., less than 30 seconds). The resulting device structure of the present invention, as shown in FIG. 13, thus provides a raised, extrinsic base 44 which forms a shallow junction into SiGe film 26, and sidewall spacers 42 which form a minimal separation between the shallow extrinsic base and emitter 52 such that base resistance is minimized.

It will be apparent to those skilled in the art that various modifications and variations can be made in the bipolar device and method of the present invention, and in construction of this bipolar device without departing from the scope or spirit of the invention. Examples of which were provided previously, and further include the following. For example, mandrel films 28, 30, 32 may be made from materials other than polysilicon and silicon nitride. Sidewall spacers 42 may formed following removal of emitter mandrel films 30, 32, and may be omitted altogether. Finally, a selective epitaxy process may be used to form raised extrinsic base 44.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A heterojunction bipolar transistor, comprising:
   a substrate including a collector layer;
   a semiconductor intrinsic base layer comprising a single crystal semiconductor selected from the group consisting of silicon and silicon germanium, overlying the collector layer;
   a raised extrinsic base layer having a bottom surface in contact with the semiconductor intrinsic base layer;
   an emitter layer formed on and forming a heterojunction with the semiconductor intrinsic base layer;
   a spacer separating the raised extrinsic base layer from the emitter layer, the spacer having a lower layer consisting essentially of an oxide, and an upper layer above the lower layer consisting essentially of a nitride, the upper layer having a first sidewall at least partially contacting the raised extrinsic base layer and a second sidewall wholly contacting the emitter layer;
   a base electrode conductively connected to the raised extrinsic base layer;
   a collector electrode conductively connected to the collector layer; and
   an emitter electrode conductively connected to the emitter layer.

2. A heterojunction bipolar transistor as recited in claim 1, wherein the raised extrinsic base layer comprises at least one material selected from the group consisting of highly-doped polysilicon and highly doped amorphous silicon.

3. A heterojunction bipolar transistor as recited in claim 1, wherein the raised extrinsic base layer has a thickness in the range of 20 to 100 nanometers.

4. A heterojunction bipolar transistor as recited in claim 1, wherein the spacer has a width in the range of 10 to 70 nanometers.

5. A heterojunction bipolar transistor as recited in claim 1, wherein the emitter layer comprises at least one material selected from the group consisting of polysilicon and amorphous silicon.

6. A heterojunction bipolar transistor as recited in claim 1, wherein the emitter layer has a thickness in the range of 30 to 200 nanometers.

7. A heterojunction bipolar transistor as recited in claim 1, wherein the emitter layer is in-situ doped with phosphorous such that drive-in and activation anneal temperatures are minimized.

8. A heterojunction bipolar transistor as recited in claim 1, wherein the raised extrinsic base layer is substantially planar.

9. A heterojunction bipolar transistor as recited in claim 1, wherein the semiconductor intrinsic base layer comprises silicon germanium.

10. A method of making a heterojunction bipolar transistor, comprising:
    providing a semiconductor intrinsic base layer comprising a single crystal semiconductor selected from the group consisting of silicon and silicon germanium, on a substrate;
    providing a collector layer on the substrate;
    providing a mandrel on the intrinsic base layer;
    providing a raised extrinsic base layer on the semiconductor intrinsic base layer after the semiconductor intrinsic base layer is provided on the substrate;
    planarizing the raised extrinsic base layer;
    recessing the raised extrinsic base layer below the top surface of the mandrel;
    thereafter removing the mandrel;
    providing an emitter layer on and forming a heterojunction with the semiconductor intrinsic base layer;
    providing a base electrode on a portion of the raised extrinsic base layer;
    providing a collector electrode on a portion of the collector layer; and
    providing an emitter electrode on a portion of the emitter layer.

11. A method of making a heterojunction bipolar transistor as recited in claim 10, wherein the raised extrinsic base layer includes at least one material selected from highly-doped polysilicon end highly-doped amorphous silicon.

12. A method of making a heterojunction bipolar transistor as recited in claim 10, wherein the raised extrinsic base layer providing step comprises planarizing the raised extrinsic base layer to a thickness in the range of 20 to 100 nanometers.

13. A method of making a heterojunction bipolar transistor as recited in claim 12, wherein the raised extrinsic base layer is planarized by chemical mechanical polishing.

14. A method of making a heterojunction bipolar transistor as recited in claim 10, further comprising providing a spacer separating the raised extrinsic base layer from the emitter layer, the spacer having a width in the range of 10 to 70 nanometers.

15. A method of making a heterojunction bipolar transistor as recited in claim 10, wherein the emitter layer includes at least one material selected from the group consisting of polysilicon and amorphous silicon.

16. A method of making a heterojunction bipolar transistor as recited in claim 10, wherein the emitter layer is provided with a thickness in the range of 30 to 200 nanometers.

17. A method of making a heterojunction bipolar transistor as recited in claim 10, further comprising in-situ doping the emitter layer with phosphorous such that drive-in and activation anneal temperatures are minimized.

18. A method of making a heterojunction bipolar transistor as recited in claim 10, wherein the silicon germanium layer is provided by blanket epitaxy.

19. A method of making a heterojunction bipolar transistor as recited in claim 10, wherein the semiconductor intrinsic base layer comprises silicon germanium.

20. The heterojunction bipolar transistor of claim 1, wherein the base electrode comprises a metal.

21. The method of claim 10 further comprising:
    providing a spacer separating the raised extrinsic base from the emitter layer, the spacer having a lower layer consisting essentially of an oxide, and an upper layer above the lower layer consisting essentially of a nitride.

22. The method of claim 10 wherein the base electrode is provided by process including depositing a metal.

23. The method of claim 10 wherein the mandrel includes a first layer and a second layer, the first layer and the second layer being composed substantially of different materials.

24. The method of claim 23 wherein the first layer comprises polysilicon and the second layer comprises a nitride.

25. The method of claim 21 wherein the upper layer of the spacer contacts the raised extrinsic base layer and the emitter layer.

26. The heterojunction bipolar transistor of claim 1, wherein the upper layer of the spacer has a bottom surface wholly contacting the lower layer of the spacer.

27. The heterojunction bipolar transistor of claim 1, wherein the upper layer of the spacer is wholly disposed over the lower layer of the spacer.

28. The heterojunction bipolar transistor of claim 1, wherein the lower layer of the spacer has a first sidewall wholly contacting the raised extrinsic base layer.

29. The heterojunction bipolar transistor of claim 28, wherein the lower layer of the spacer has a second sidewall opposite the first sidewall, the second sidewall wholly contacting the emitter layer.

30. The heterojunction bipolar transistor of claim 26, wherein the lower layer of the spacer has a single top surface and a single bottom surface, the top surface of the lower layer wholly contacting the bottom surface of the upper layer.

31. The heterojunction bipolar transistor of claim 30, wherein the bottom surface of the lower layer of the spacer wholly contacts the semiconductor intrinsic base layer.

32. The heterojunction bipolar transistor of claim 1, wherein the lower layer of the spacer has a single planar top surface, oriented in a horizontal direction parallel to a major plane of the semiconductor intrinsic base layer, a single horizontally oriented planar bottom surface, and first and second sidewalls disposed between the top and bottom surfaces, wherein the first sidewall wholly contacts the raised extrinsic base layer, the second sidewall wholly contacts the emitter layer, the top surface wholly contacts the upper layer and the bottom surface wholly contacts the semiconductor intrinsic base layer.

33. The heterojunction bipolar transistor of claim 1, wherein the raised extrinsic base layer is formed on the semiconductor intrinsic base layer and has a bottom surface in full contact with the semiconductor intrinsic base layer.

34. A bipolar transistor, comprising:

a substrate including a collector layer;

a semiconductor intrinsic base layer comprising a single crystal semiconductor selected from the group consisting of silicon and silicon germanium, disposed over the collector layer;

an extrinsic base layer conductively connected to the semiconductor intrinsic base layer;

an emitter layer contacting the semiconductor intrinsic base layer; and a spacer separating the extrinsic base layer from the emitter layer, the spacer having a lower layer consisting essentially of an oxide, and an upper layer disposed above the lower layer and consisting essentially of a nitride, the upper layer having a first sidewall at least partially contacting the extrinsic base layer and second sidewall wholly contacting the emitter layer.

* * * * *